(12) United States Patent
Koizumi

(10) Patent No.: US 7,245,182 B2
(45) Date of Patent: Jul. 17, 2007

(54) HIGH FREQUENCY AMPLIFIER CIRCUIT

(75) Inventor: Haruhiko Koizumi, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 132 days.

(21) Appl. No.: 11/062,699

(22) Filed: Feb. 23, 2005

(65) Prior Publication Data

US 2005/0184806 A1    Aug. 25, 2005

(30) Foreign Application Priority Data

Feb. 25, 2004    (JP)    ............. 2004-049618

(51) Int. Cl.
*H03F 3/04*    (2006.01)
(52) U.S. Cl. .................................... 330/289
(58) Field of Classification Search ............... 330/289, 330/285, 296, 298
See application file for complete search history.

(56) References Cited

U.S. PATENT DOCUMENTS 5,150,076 A    9/1992  Asazawa
6,437,647 B1 *  8/2002  Fowler ................. 330/288
6,566,954 B2    5/2003  Miyazawa

FOREIGN PATENT DOCUMENTS

JP    63281505    11/1988
JP    2002 009558    1/2002

OTHER PUBLICATIONS

Japanese Office Action dated May 26, 2006 with English translation.

* cited by examiner

*Primary Examiner*—Benny Lee
*Assistant Examiner*—Hieu Nguyen
(74) *Attorney, Agent, or Firm*—Stevens, Davis, Miller & Mosher, LLP

(57) ABSTRACT

A high frequency amplifier circuit has a bias supplying transistor for supplying a bias current to an amplifying transistor, and first and second temperature compensating transistors for compensating the temperature properties of the base voltage of the bias supplying transistor. The base of the bias supplying transistor and the base of the first temperature compensating transistor are connected by a resistor in order to keep the base voltage of the bias supplying transistor approximately constant without following a change in the base voltage of the first temperature compensating transistor, even in the case where such a change occurs. The temperature compensating transistors, the bias supplying transistor and the resistor are formed in one multi-emitter type transistor.

4 Claims, 6 Drawing Sheets

RELATED ART

HIGH FREQUENCY AMPLIFIER CIRCUIT

BACKGROUND OF THE INVENTION

1. Field of the Invention

The present invention relates to a high frequency amplifier circuit that uses a hetero-junction bipolar transistor (HBT). In addition, the present invention relates to an integrated circuit that is used for the transmitter or receiver part of a mobile communication terminal.

2. Prior Art

In recent years, HBT's have come to be used in place of field effect transistors (FET's) in microwave monolithic integrated circuits that include power amplifiers, low noise amplifier LNA, down converter, in mobile communication terminals such as cellular phones.

The advantages of using HBT's include the following:

1) No negative power supply is required for an amplification and a gain control operation;

2) Excellent distortion properties are provided because of a high linearity in HBTs.

Contrarily, defects include the requirement of a bias circuit in order to compensate for temperature dependency and power supply dependency. How this bias circuit is designed has become an important point for gaining stable properties.

In the following, a high frequency amplifier circuit according to the prior art is described in reference to the drawings.

FIG. 6 is a circuit diagram showing a high frequency amplifier circuit that uses an emitter follower transistor type constant voltage supply bias circuit according to the prior art which is shown in Japanese Unexamined Patent Publication 2002-9558.

In FIG. 6, the emitter of a bias supplying transistor 2 for supplying a bias current to an amplifying transistor 1 is connected via a resistor 3 to the base of amplifying transistor 1 made of, for example, an HBT. This bias supplying transistor 2 provides an emitter follower configuration where the emitter is grounded via a resistor 4. In FIG. 6, the portion surrounded by a broken line is a bias circuit.

In addition, the base of bias supplying transistor 2 is connected to the base of a first temperature compensating transistor 5. Furthermore, the collector of a second temperature compensating transistor 6 and a resistor 7 are connected to the base of first temperature compensating transistor 5. The base of second temperature compensating transistor 6 is connected to the emitter of first temperature compensating transistor 5, and in addition, is grounded via resistor 8.

The emitter of second temperature compensating transistor 6 is grounded. The other end of resistor 7 is connected to a bias voltage supplying terminal 9. The collectors of bias supplying transistor 2 and first temperature compensating transistor 5 are connected to a power supply terminal 10. In addition, an input signal terminal 11 is connected to the base of amplifying transistor 1, and an output signal terminal 12 is connected to the collector. The emitter of amplifying transistor 1 is grounded.

Next, the operation of the high frequency amplifier circuit according to the prior art is described.

A regulated voltage of 2.8 V for example, is supplied to bias voltage supplying terminal 9 by means of a power supply circuit. At this time, a voltage that exceeds the turn-on voltage, approximately 1.3 V, is applied across the base and the emitter of each of bias supplying transistor 2, first temperature compensating transistor 5 and second temperature compensating transistor 6. Therefore, each of transistors 2, 5 and 6 is turned on, and consequently amplifying transistor 1 is driven.

The collector current of amplifying transistor 1 is determined by the emitter current of bias supplying transistor 2, and this emitter current is determined primarily by the resistance value of resistor 7. In addition, in order to cancel a change caused by temperature in the voltages between the bases and the emitters of amplifying transistor 1 and bias supplying transistor 2, first temperature compensating transistor 5 and second temperature compensating transistor 6 are connected in two stages.

Usually, a regulated voltage as described above is provided as the voltage that is applied to bias voltage supplying terminal 9, and therefore, the amount of change in the voltage is comparatively small. For example, the voltage may be 2.8 V+/-5%, that is to say, the amount of change, the difference between 2.66 V and 2.94 V, may be approximately 0.3 V. In the case where a regulated voltage is not supplied for some reason, or in the case where a regulated voltage does not exist within the apparatus, however, bias voltage supplying terminal 9 is directly connected to a battery which is the power supply. Therefore, the amount of change in the voltage becomes large. For example, the voltage may be 3.5 V+/-15%, that is to say, the amount of change, may be approximately 1 V.

FIG. 2 shows an example of the relationship between the voltage (hereinafter referred to as reference voltage) that is applied to bias voltage supplying terminal 9 and the collector current of amplifying transistor 1 in the high frequency amplifier circuit that uses a bias circuit according to the prior art. FIG. 2 shows the results of a case where the applied voltage is swept from 3 V to 4 V in the condition where the bias circuit is designed so as to make the collector current 10 mA when the reference voltage is 3.5 V. In FIG. 2, the broken line indicates the prior art, and the solid line indicates the below described embodiment.

As can be seen from this figure, the collector current fluctuates from 7.2 mA to 12.4 mA when the applied voltage is in a range from 3 V from 4V, and as a result, high frequency properties of the amplifier, such as power gain and distortion characteristics, also fluctuate a great deal.

SUMMARY OF THE INVENTION

In view of the above, an object of the present invention is to provide a high frequency amplifier circuit that can reduce dependency on the voltage of the bias voltage supplying terminal in the collector current of the amplifying transistor, with the temperature dependency of the above collector current kept low.

In addition, an increase in the area of the bias circuit on a semiconductor chip in comparison with the prior art, caused by an increase in the number of elements in the bias circuit, is very disadvantageous, taking cost into consideration. Therefore, another object, in addition to the above described object, is to reduce the area of the bias circuit part.

In order to achieve the above described objects, a high frequency amplifier circuit according to the present invention is provided with: an amplifying transistor; a bias voltage supplying terminal; a bias supplying transistor for supplying a bias current to the base of the amplifying transistor in accordance with the voltage that is applied to the base of the bias supplying transistor from the bias voltage supplying terminal; a first temperature compensating transistor for allowing a current to flow through in accordance with the voltage that is applied to the base of the first temperature compensating transistor from the bias voltage supplying terminal; a second temperature compensating transistor for compensating for the temperature properties of the base voltage of the bias supplying transistor by correcting the bias current that is supplied from the bias supplying transistor to the base of the amplifying transistor in accordance with the current that flows through the first temperature compensating transistor; and a base voltage stabilization means for keeping the base voltage of the bias supplying transistor approximately constant in a manner where the base voltage of the bias supplying transistor does not follow a change in the base voltage of the first temperature compensating transistor, even in the case where such a change occurs.

Here, a resistor is connected, for example, between the base of the bias supplying transistor and the base of the first temperature compensating transistor, and the bias voltage supplying terminal is connected to the terminal of the resistor on the side of the base of the first temperature compensating transistor, and thereby, the resistor forms a base voltage stabilization means as described above.

The bases of the first temperature compensating transistor and the bias supplying transistor are at the same potential according to the prior art. Therefore, when the voltage that is supplied to the bias voltage supplying terminal increases, the base voltage of the bias supplying transistor monotonously increases in response to this.

According to the present invention, however, when the voltage that is supplied to the bias voltage supplying terminal increases, the current that flows through this bias voltage supplying terminal increases, and therefore, the voltage that is applied to the resistor that has been inserted according to the present invention gradually increases. As a result, an increase in the collector voltage of the second temperature compensating transistor and in the base voltage of the bias supplying transistor, which is at the same potential as the collector voltage, is suppressed.

Furthermore, when the voltage that is supplied to the bias voltage supplying terminal increases, the base voltages of the first and second temperature compensating transistors keep increasing, and therefore, the collector voltage of the second temperature compensating transistor and the base voltage of the bias supplying transistor, which is at the same potential as the collector voltage, gradually decreases from a specific supply voltage value. The voltage that becomes this turning point can be freely changed by selecting an appropriate resistance value for the resistor. Accordingly, fluctuation in the base voltage of the bias supplying transistor can be suppressed within a desired range of the voltage that is applied to the bias voltage supplying terminal.

Accordingly, fluctuation in the current (emitter current of the bias supplying transistor) that is supplied to the base of the amplifying transistor is also reduced, and therefore, fluctuation in the collector current is also reduced. As a result, the high frequency amplifier circuit conducts a stable high frequency operation relative to the fluctuation in the voltage of the bias voltage supplying terminal.

Here, the resistance value of the above described resistor changes depending on the set value of the collector current of the amplifying transistor, and the sizes (or dimensions) of the respective transistors used in the bias circuit.

In addition, it is preferable to form the three elements, the bias supplying transistor and the first temperature compensating transistor, as well as the resistor that connects the bases of the respective transistors in the bias circuit of the high frequency amplifier circuit according to the present invention, of one multi-emitter type transistor having a built-in resistor. This multi-emitter type transistor has a structure where a number of emitters and a number of bases are provided on a common collector, and a resistor element is formed in a state where it connects the number of bases to each other.

According to the present invention, a portion of the bias circuit can be handled as one device during the process that is the same as the conventional process, to which a new process is not added.

The high frequency amplifier circuit according to the present invention is provided with a base voltage stabilization means for keeping the base voltage of the bias supplying transistor approximately constant without allowing the base voltage of the bias supplying transistor to follow a change in the base voltage of the first temperature compensating transistor, even in the case where such a change occurs, and thereby, fluctuation in the base voltage of the bias supplying transistor is reduced, even when the voltage that is supplied to the bias voltage supplying terminal fluctuates. Therefore, dependency on the voltage of the bias voltage supplying terminal in the collector current of the amplifying transistor can be reduced, while keeping temperature dependency low. Therefore, an amplifier which is stable against change in the voltage can be obtained.

The base voltage stabilization means can be implemented by connecting a resistor between, for example, the base of the bias supplying transistor and the base of the first temperature compensating transistor, and by connecting the bias voltage supplying terminal to the terminal of the resistor on the side of the base of the first temperature compensating transistor, and in this case, the resistor is added to the configuration according to the prior art, as the only element for stabilization of the base voltage. Therefore, an increase in the cost for the stabilization of the base voltage can be kept to the minimum.

In addition, in the case where the base of the bias supplying transistor, the first temperature compensating transistor and the resistor are formed of one multi-emitter type transistor in the high frequency amplifier circuit according to the present invention, the area of the bias circuit on a semiconductor chip can be reduced in comparison with the prior art, and as a result, cost reduction becomes possible.

DESCRIPTION OF THE PREFERRED EMBODIMENTS

In the following, the embodiments of the present invention are described in reference to the drawings.

EMBODIMENT 1

Figure 1:
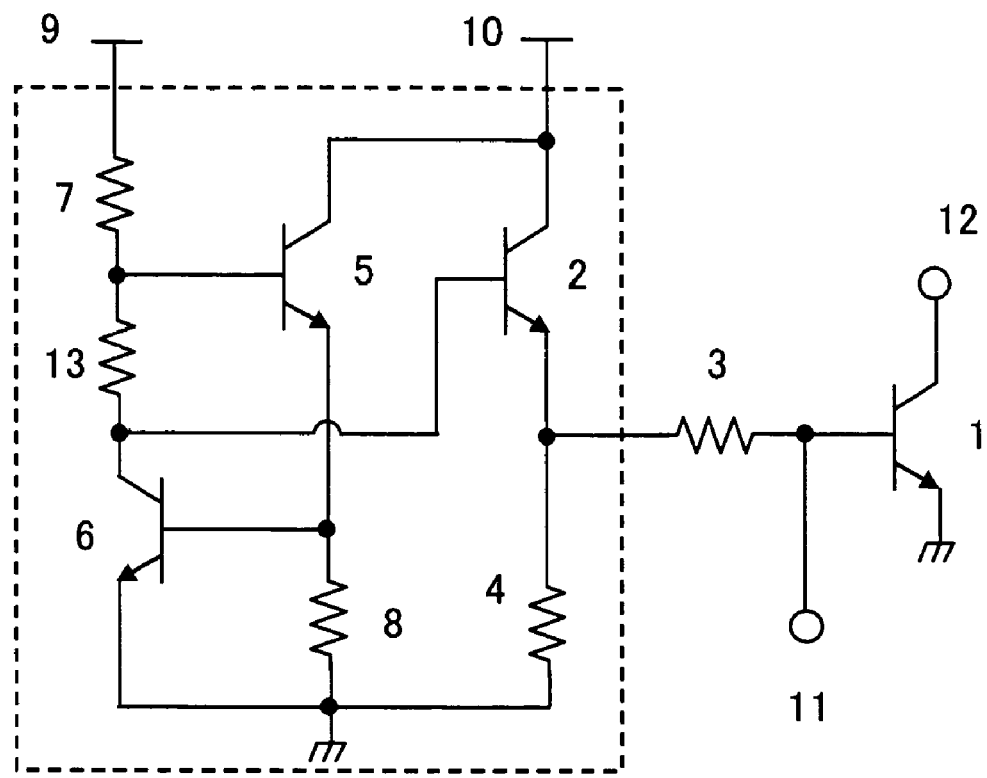
FIG. 1 is a circuit diagram showing the configuration of a high frequency amplifier circuit according to Embodiment 1 of the present invention.

FIG. 1 is a circuit diagram showing a high frequency amplifier circuit according to the first embodiment of the present invention. Here, in FIG. 1, the same symbols are attached to components that are the same as those of the high frequency amplifier circuit according to the prior art.

In the high frequency amplifier circuit of FIG. 1, the emitter of a bias supplying transistor 2 for supplying a bias current to an amplifying transistor 1 is connected via a resistor 3 to the base of the amplifying transistor 1, which is made of, for example, an HBT. The emitter of bias supplying transistor 2 is grounded via a resistor 4, and thus forms an emitter follower configuration. In FIG. 1, the portion surrounded by a broken line is a bias circuit.

In addition, the base of bias supplying transistor 2 is connected to the collector of a second temperature compensating transistor 6, and is connected to the base of a first temperature compensating transistor 5 via a resistor 13. The base of first temperature compensating transistor 5 is connected to a bias voltage supplying terminal 9 via a resistor 7. Furthermore, the base of second temperature compensating transistor 6 is connected to the emitter of first temperature compensating transistor 5, and furthermore, is grounded via a resistor 8. The emitter of second temperature compensating transistor 6 is grounded. The collectors of bias supplying transistor 2 and first temperature compensating transistor 5 are connected to a power supply terminal 10. In addition, an input signal terminal 11 is connected to the base of amplifying transistor 1, and an output signal terminal 12 is connected to the collector. The emitter of amplifying transistor 1 is grounded.

As described above, the base of bias supplying transistor 2 is connected to the base of first temperature compensating transistor 5 via resistor 13, and bias voltage supplying terminal 9 is connected to the terminal of resistor 13 on the side of the base of first temperature compensating transistor 5 via a resistor 7. This allows for a setting where the base voltage of bias supplying transistor 2 is kept approximately constant without following a change in the base voltage of first temperature compensating transistor 5.

Next, the operation of the high frequency amplifier circuit according to Embodiment 1 is described.

The voltage that is supplied to bias voltage supplying terminal 9 needs not necessarily to be regulated. For example, the voltage that is supplied to bias voltage supplying terminal 9 is 3.5 V+/−15%, that is to say, has an amount of change of approximately 1 V, assuming a direct connection from a battery. At this time, a voltage that exceeds the turn-on voltage, approximately 1.3 V, is applied across the base and the emitter of each of bias supplying transistor 2, first temperature compensating transistor 5 and second temperature compensating transistor 6. Therefore, bias supplying transistor 2, first temperature compensating transistor 5 and second temperature compensating transistor 6 are turned on. As a result, amplifying transistor 1 is driven.

Bias supplying transistor 2 supplies a bias current to the base of amplifying transistor 1 in accordance with the voltage that is applied to the base of bias supplying transistor 2 from bias voltage supplying terminal 9. In addition, first temperature compensating transistor 5 allows a current to flow through in accordance with the voltage that is applied to the base of first temperature compensating transistor 5 from bias voltage supplying terminal 9. Second temperature compensating transistor 6 compensates for the temperature properties of the base voltage of bias supplying transistor 2 by correcting the bias current that is supplied from bias supplying transistor 2 to the base of amplifying transistor 1 in accordance with the current that flows through first temperature compensating transistor 5.

The collector current of amplifying transistor 1 is determined by the emitter current of bias supplying transistor 2, and this emitter current is determined primarily by the value of resistor 7. In addition, the value of resistor 13 is determined so as to suppress fluctuation in the emitter current of bias supplying transistor 2 in accordance with the voltage fluctuation value that is assumed in bias voltage supplying terminal 9 shown in the above.

Resistor 13 that is connected between the base of bias supplying transistor 2 and the base of first temperature compensating transistor 5 forms a base voltage stabilization means for keeping the base voltage of bias supplying transistor 2 approximately constant without following a change in the base voltage of first temperature compensation transistor 5, even in the case where such a change occurs.

Here, the reason why fluctuation in the emitter current of bias supplying transistor 2 can be suppressed by inserting resistor 13 is described.

When the voltage that is supplied to bias voltage supplying terminal 9 is increased by selecting an appropriate resistance value for resistor 13, the amount of the current that flows through this terminal increases, and thus, the voltage that is applied to resistor 13 gradually increases, suppressing an increase in the corrector voltage of second temperature compensating transistor 6 and in the base voltage of bias supplying transistor 2, which is at the same potential as the corrector voltage. Furthermore, when the supply voltage increases, the base voltages of first and second temperature compensating transistors 5 and 6 also keep rising, and therefore, the collector voltage of second temperature compensating transistor 6 and the base voltage of bias supplying transistor 2, which is at the same potential as the collector voltage, gradually begins to decrease from a specific supply voltage value. As a result, fluctuation in the collector voltage of second temperature compensating transistor 6, that is to say, fluctuation in the base voltage of bias supplying transistor 2, which is at the same potential as the collector voltage, are suppressed. Accordingly, fluctuation in the current (emitter current of bias supplying transistor 2) that is supplied to the base of amplifying transistor 1 is also reduced, and thus, fluctuation in the collector current is reduced. As a result, the high frequency amplifier circuit conducts a stable high frequency operation relative to fluctuation in the voltage of bias voltage supplying terminal 9.

Here, an example of the range of settings for resistance values of resistor 13 and resistors 7 and 8 is described. The resistance value of each resistor varies depending on the set value of the collector current of the amplifying transistor, the range of the voltage to be stabilized, the size (or dimensions) of the transistors and the structure of the epitaxial layers. Resistor 13 is in a range from 10 Ω to 300 Ω, approximately. Resistor 7 is in a range from 500 Ω to 1 kΩ, and resistor 8 is in a range from 2 kΩ to 3 kΩ. Here, in some cases, a resistor, not shown, is inserted between the emitter of temperature compensating transistor 5 and resistor 8 or the base of temperature compensating transistor 6 in FIG. 1, and the resistance values of resistor 13 and resistors 7 and 8 slightly vary depending on the value of this resistor.

Figure 2:
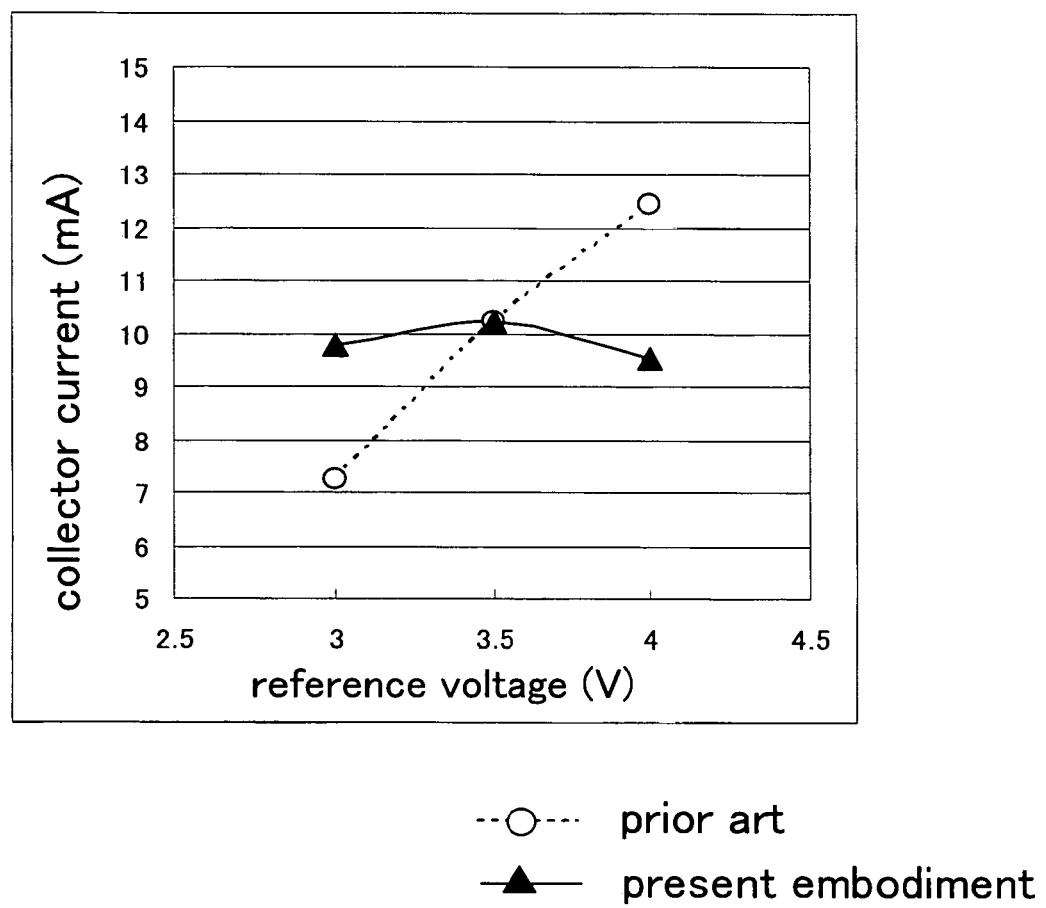
FIG. 2 is a property graph showing the relationship between the voltage that is applied to the bias voltage supplying terminal and the collector current of the amplifying transistor in a high frequency amplifier circuit that uses a bias circuit according to Embodiment 1 of the present invention, and in a high frequency amplifier circuit that uses a bias circuit according to the prior art.
Figure 6:
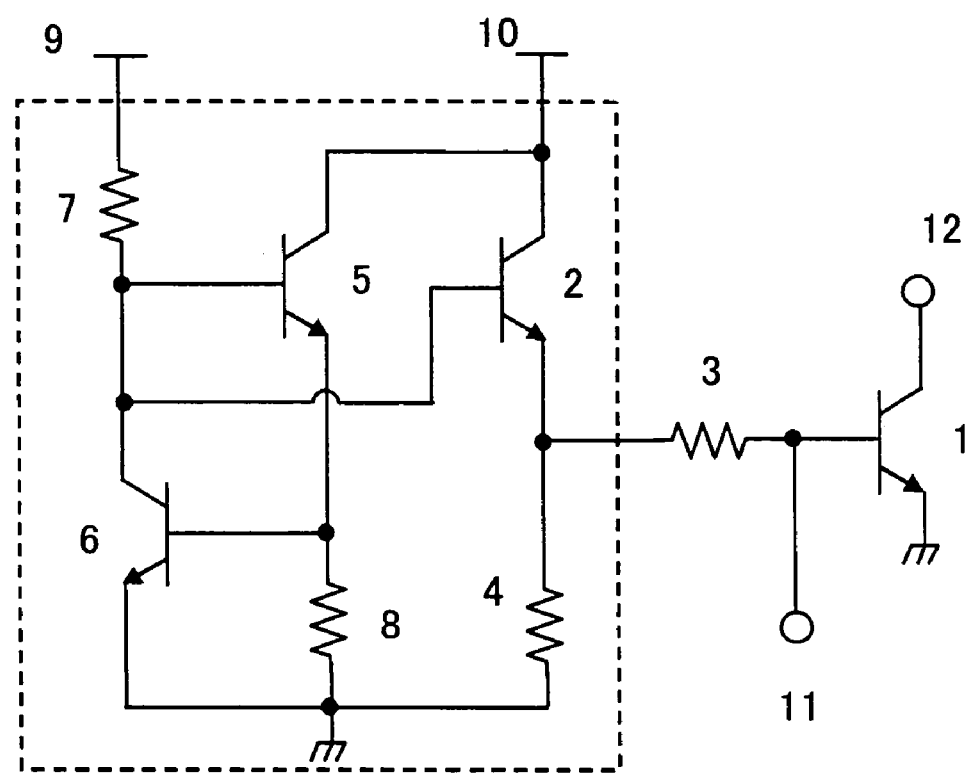
FIG. 6 is a circuit diagram showing the configuration of a high frequency amplifier circuit according to the prior art.

FIG. 2 shows the voltage fluctuation dependency in the case where the collector current of amplifying transistor 1 is set at 10 mA for a reference voltage of 3.5 V in the high frequency amplifier circuit that uses a bias circuit (shown in FIG. 1) according to Embodiment 1, and in the high frequency amplifier circuit that uses a bias circuit (shown in FIG. 6) according to the prior art. It can be seen from FIG. 2 that the amount of change in the collector current is reduced a great deal in comparison with the prior art. That is to say, it can be seen that resistor 13 that is connected between the base of bias supplying transistor 2 and the base of first temperature compensating transistor 5 stabilizes the base voltage of amplifying transistor 1, in other words, the voltage across the base and the emitter of bias supplying transistor 2.

EMBODIMENT 2

Figure 3:
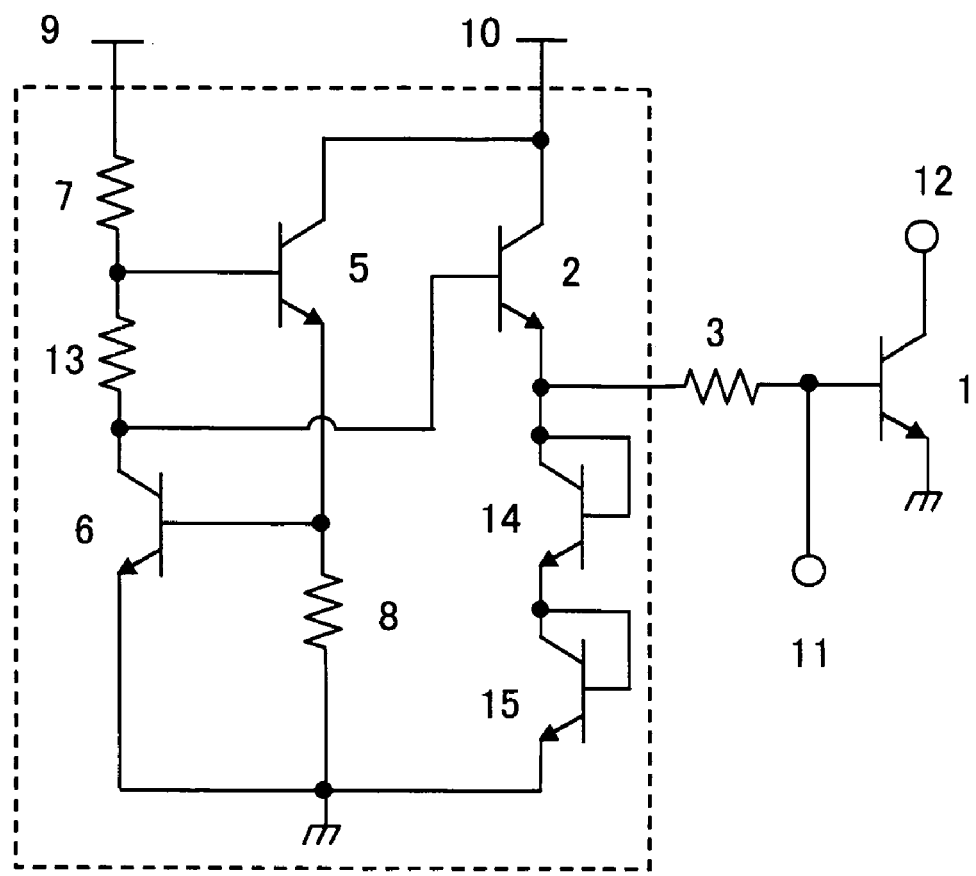
FIG. 3 is a circuit diagram showing the configuration of a high frequency amplifier circuit according to Embodiment 2 of the present invention.

FIG. 3 is a circuit diagram showing a high frequency amplifier circuit according to Embodiment 2 of the present invention. This circuit is different from that of Embodiment 1 in that resistor 4 that is connected to the emitter of bias supplying transistor 2 in Embodiment 1 is replaced with two transistors 14 and 15 of which the bases and the collectors are connected in Embodiment 2. The above described transistors 14 and 15 are equivalent to PN junction diodes. In FIG. 3, the portion surrounded by a broken line is a bias circuit.

The operation according to Embodiment 2 is basically the same as the operation according to Embodiment 1, and therefore, detailed description thereof is herein omitted. In Embodiment 2, however, the emitter current of bias supplying transistor 2 can be made to fluctuate in accordance with the input power level of amplifying transistor 1 due to the existence of transistors 14 and 15. Accordingly, it is desirable to use Embodiment 2 in operation conditions when a higher input power or and a higher output power are required in amplifying transistor 1.

Here, the operation principles of transistors 14 and 15 are described. In the case where a signal that is inputted into amplifying transistor 1 is low, transistors 14 and 15 operate as high resistivity, because the emitter voltage of bias supplying transistor 2 is low. In the case where the above described signal is high, however, the emitter voltage bias supplying transistor 2 increases. As the voltage that is applied to transistors 14 and 15 becomes high, it becomes to flow a current into transistors 14 and 15. That is to say, the transistors operate as low resistivity. Though in the case of Embodiment 1, this element is a fixed resistor, this element is made up of diodes which operate as a variable resistor in accordance with the power level of the input signal in the present embodiment.

In the case of a high output power, it is necessary to set the bias so that a large amount of base current of amplifying transistor 1 may flow, and generally, it is done by reducing the resistance value of resistor 4 in Embodiment 1. However, high frequency loss increases as a low resistivity is inserted parallel to the input of amplifying transistor 1. Therefore, it is preferable to use diodes in the case of a high output, which have high impedance at high frequency.

EMBODIMENT 3

Figure 4A:
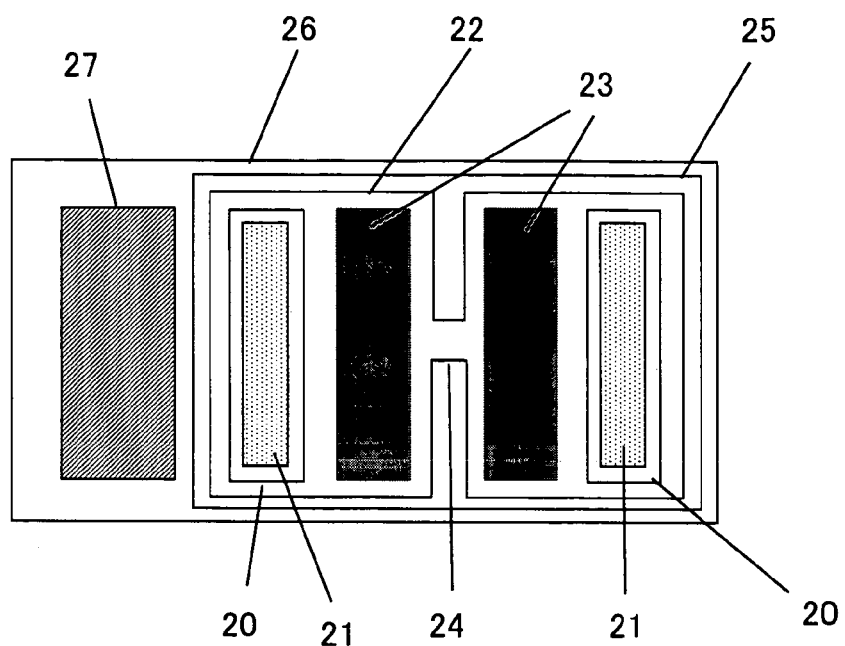
FIGS. 4A and 4B are respectively a plan diagram and a cross-sectional diagram showing the structure of a bias circuit in a high frequency amplifier circuit according to Embodiment 3 of the present invention.
Figure 4B:
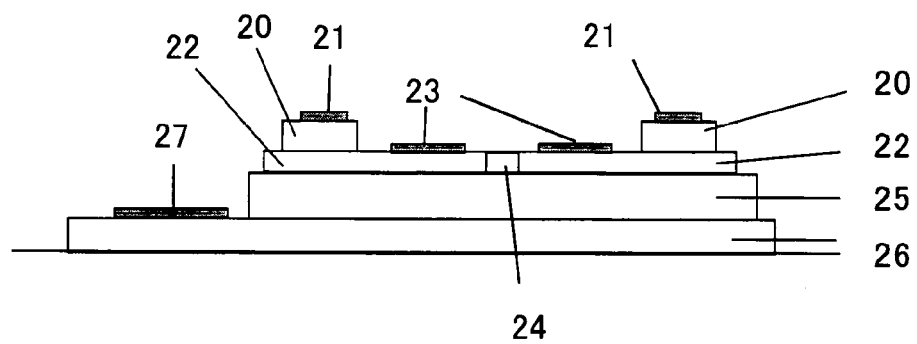

FIGS. 4A and 4B show the structure of a bias circuit for a high frequency amplifier circuit according to Embodiment 3 of the present invention. In this Embodiment 3, the structure of the bias circuit of a high frequency amplifier circuit and a method for forming the same are concretely described. FIG. 4A is a overhead view showing the bias circuit, and FIG. 4B is a cross-sectional view of this bias circuit. In the present embodiment, a case where a semiconductor resistor used as the resistor 13 of FIG. 1 is described.

The bias circuit is formed on a wafer where epitaxial semiconductor layers have been formed on a semi-insulating GaAs substrate in order of the sub-collector layer, the collector layer, the base layer, the emitter layer. The embodiment of the present invention is characterized by the following processing. That is to say, in FIGS. 4A and 4B, two emitter mesa regions 20 are formed by means of etching, and emitter electrodes 21 are formed by means of deposition. Next, two base mesa regions 22 are formed by means of etching, and base electrodes 23 are formed by means of deposition. At this time, two base mesa regions 22 are formed in such a manner that a portion of the base remains between the two regions, so that a semiconductor resistor 24 can be formed. Furthermore, a collector mesa region 25 and a sub-collector mesa region 26 are formed in this order, and finally, a collector electrode 27 is formed by means of deposition.

By providing such a structure, two transistors and one resistor can be formed in a multi-emitter type transistor, where the collector is shared by the transistors, while the emitters are separated from each other and the resistor is inserted between the bases.

The bias circuit of the high frequency amplifier circuit shown in FIG. 1 can be fabricated, for example, by using the transistor on the left side in FIGS. 4A and 4B as bias supplying transistor 2, by using the transistor on the right side as first temperature compensating transistor 5, by using semiconductor resistor 24 that has been formed in the base layer as resistor 13, and by providing wires (not shown) to the respective electrodes of the bases, the emitters and the collector for connection to other transistors and resistors (not shown).

Semiconductor resistor 24 is designed using the sheet resistance of the base layer, which value is, for example, 200 $\Omega$/SQUARE.

According to this Embodiment 3, bias supplying transistor 2, first temperature compensating transistor 5 and resistor 13 can be formed of one multi-emitter type transistor, and the area of the bias circuit part can be reduced.

EMBODIMENT 4

Figure 5A:
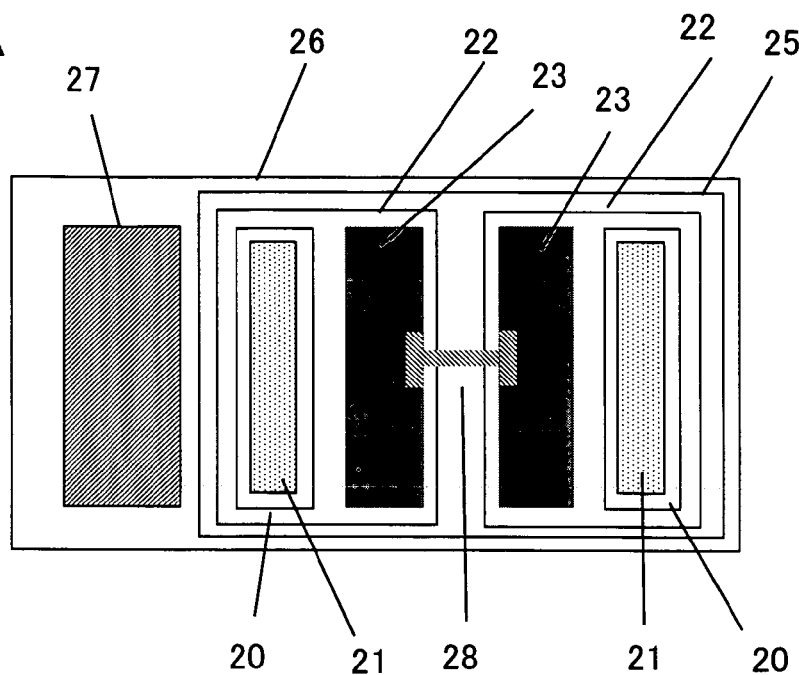
FIGS. 5A and 5B are respectively a plan diagram and a cross-sectional diagram showing the structure of a bias circuit in a high frequency amplifier circuit according to Embodiment 4 of the present invention.
Figure 5B:
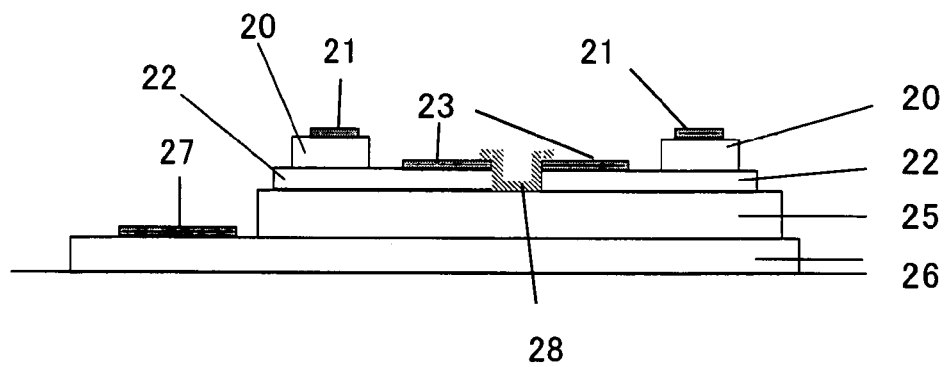

FIGS. 5A and 5B show the structure of a bias circuit for a high frequency amplifier circuit according to Embodiment 4 of the present invention. In this Embodiment 4, the structure of the bias circuit of the high frequency amplifier circuit and a method for forming the same are concretely described. FIG. 5A is a overhead view showing the bias circuit, and FIG. 5B is a cross-sectional view showing this bias circuit. In the present embodiment, a case where a metal thin film resistor is used as the resistor 13 of FIG. 1 is described.

In FIGS. 5A and 5B, two emitter mesa regions 20 are formed by means of etching, and emitter electrodes 21 are formed by means of deposition. Next, two base mesa regions 22 are formed by means of etching, and base electrodes 23 are formed by means of deposition. The bias circuit is different from that of FIGS. 4A and 4B in that two base mesa regions 22 are in such a form as to be independent from each other. Next, a metal thin film resistor 28 is formed so as to make contact with portions of two base electrodes 23. The forms of collector mesa region 25, sub-collector mesa region 26 and collector electrode 27 are the same as those in FIGS. 4A and 4B.

By providing such a structure, two transistors and one resistor can be formed in a multi-emitter type transistor where the collector is shared by the transistors, the emitters are separated from each other, and a resistor is inserted between the bases.

In the same manner as in FIGS. 4A and 4B, the bias circuit of the high frequency amplifier circuit shown in FIG. 1 can be fabricated, for example, by using the transistor on the left side in FIGS. 5A and 5B as bias supplying transistor 2, by using the transistor on the right side as first temperature compensating transistor 5, by using metal thin film resistor 28 as resistor 13, and by providing wires (not shown) to the respective electrodes of the bases, the emitters and the collector for connection to other transistors and resistors (not shown).

Metal thin film resistor may be formed of a tungsten silicon thin film having, for example, a sheet resistance of 100 Ω/SQUARE.

According to this Embodiment 4, the same effects as those of Embodiment 3 can be gained.

INDUSTRIAL APPLICABILITY

As described above, the present invention is useful in the case where high frequency properties are desired to be kept constant when the amount of fluctuation in the voltage that is supplied to the bias voltage supplying terminal is large in a high frequency amplifier circuit.

The invention claimed is:

1. A high frequency amplifier circuit, comprising:
   an amplifying transistor;
   a bias voltage supplying terminal;
   a bias supplying transistor for supplying a bias current from the emitter to the base of said amplifying transistor in accordance with the voltage that is applied to the base of the bias supplying transistor from said bias voltage supplying terminal;
   a first resistor positioned in a current path extending from the emitter of said base supplying transistor to the base of said amplifying transistor;
   a first temperature compensating transistor for allowing a current to flow through in accordance with the voltage that is applied to the base of the first temperature compensating transistor from said bias voltage supplying terminal;
   a second temperature compensating transistor having the collector directly connected to the base of said bias supplying transistor, for compensating for the temperature properties of the base voltage of said bias supplying transistor by correcting the bias current that is supplied to the base of said amplifying transistor from the emitter of said bias supplying transistor in accordance with the current that flows through said first temperature compensating transistor; and
   a base voltage stabilization section that keeps the base voltage of said bias supplying transistor approximately constant without following a change in the base voltage of said first temperature compensating transistor, even in the case where such a change occurs, wherein:
   a second resistor is connected between the base of said bias supplying transistor and the base of said first temperature compensating transistor, and said bias voltage supplying terminal is connected to the terminal of said second resistor on the side of the base of said first temperature compensating transistor, and thereby, said second resistor forms said base voltage stabilization section.

2. The high frequency amplifier circuit according to claim 1, wherein said bias supplying transistor, said first temperature compensating transistor and said second resistor are formed in one multi-emitter type transistor, where a number of emitters and a number of bases are provided on a common collector, and a resistor element is formed in a state of connecting said number of bases to each other.

3. The high frequency amplifier circuit according to claim 2, wherein said resistor element is formed of a semiconductor resistor.

4. The high frequency amplifier circuit according to claim 2, wherein said resistor element is formed of a metal thin film resistor.

* * * * *